US012604762B2

(12) United States Patent　　　(10) Patent No.: US 12,604,762 B2

Goh et al.　　　(45) Date of Patent: Apr. 14, 2026

(54) METHODS AND APPARATUS TO REDUCE THICKNESS OF ON-PACKAGE MEMORY ARCHITECTURES

(71) Applicant: Intel Corporation, Santa Clara, CA (US)

(72) Inventors: Eng Huat Goh, Ayer Itam (MY); Jiun Hann Sir, Gelugor (MY); Poh Boon Khoo, Perai (MY)

(73) Assignee: Intel Corporation, Santa Clara, CA (US)

( * ) Notice: Subject to any disclaimer, the term of this patent is extended or adjusted under 35 U.S.C. 154(b) by 984 days.

(21) Appl. No.: 17/542,107

(22) Filed: Dec. 3, 2021

(65) Prior Publication Data

US 2023/0178502 A1　　Jun. 8, 2023

(51) Int. Cl.
　*H01L 23/00*　　(2006.01)
　*H01L 25/00*　　(2006.01)
　*H01L 25/065*　　(2023.01)
　*H01L 25/18*　　(2023.01)

(52) U.S. Cl.
　CPC .......... *H01L 24/05* (2013.01); *H01L 25/0657* (2013.01); *H01L 25/18* (2013.01); *H01L 25/50* (2013.01); *H01L 2224/05017* (2013.01); *H01L 2225/0651* (2013.01); *H01L 2225/06562* (2013.01); *H01L 2225/06582* (2013.01); *H01L 2225/06589* (2013.01)

(58) Field of Classification Search
　CPC ..... H01L 24/05; H01L 25/0657; H01L 25/18;

H01L 25/50; H01L 2224/05017; H01L 2225/0651; H01L 2225/06562; H01L 2225/06582; H01L 2225/06589; H01L 23/5385; H01L 23/49548; H01L 23/49575; H01L 23/49816; H01L 24/06; H01L 24/17; H01L 24/81; H01L 21/4832; H01L 23/3675; H01L 25/105; H01L 24/13; H01L 24/16

See application file for complete search history.

(56) References Cited

U.S. PATENT DOCUMENTS

| | | | | |
|---|---|---|---|---|
| 6,872,599 | B1 * | 3/2005 | Li | ............... H01L 24/97 |
| | | | | 438/15 |
| 2013/0082395 | A1 * | 4/2013 | Crisp | .......... H01L 25/0652 |
| | | | | 257/773 |
| 2021/0074602 | A1 * | 3/2021 | Hsu | ........ H01L 23/3135 |

* cited by examiner

*Primary Examiner* — Fernando L Toledo
*Assistant Examiner* — Jorge Andres Lopez
(74) *Attorney, Agent, or Firm* — Hanley, Flight & Zimmerman, LLC

(57) ABSTRACT

Methods and apparatus to reduce thickness of on-package memory architectures are disclosed. An on-package memory architecture includes a memory die; a bonding pad including a first surface and a second surface opposite the first surface; a wire bond electrically coupling the memory die to the first surface of the bonding pad; and a metal stub protruding from the second surface of the bonding pad. The metal stub is to electrically couple with a contact pad on a package substrate of an integrated circuit (IC) package.

22 Claims, 13 Drawing Sheets

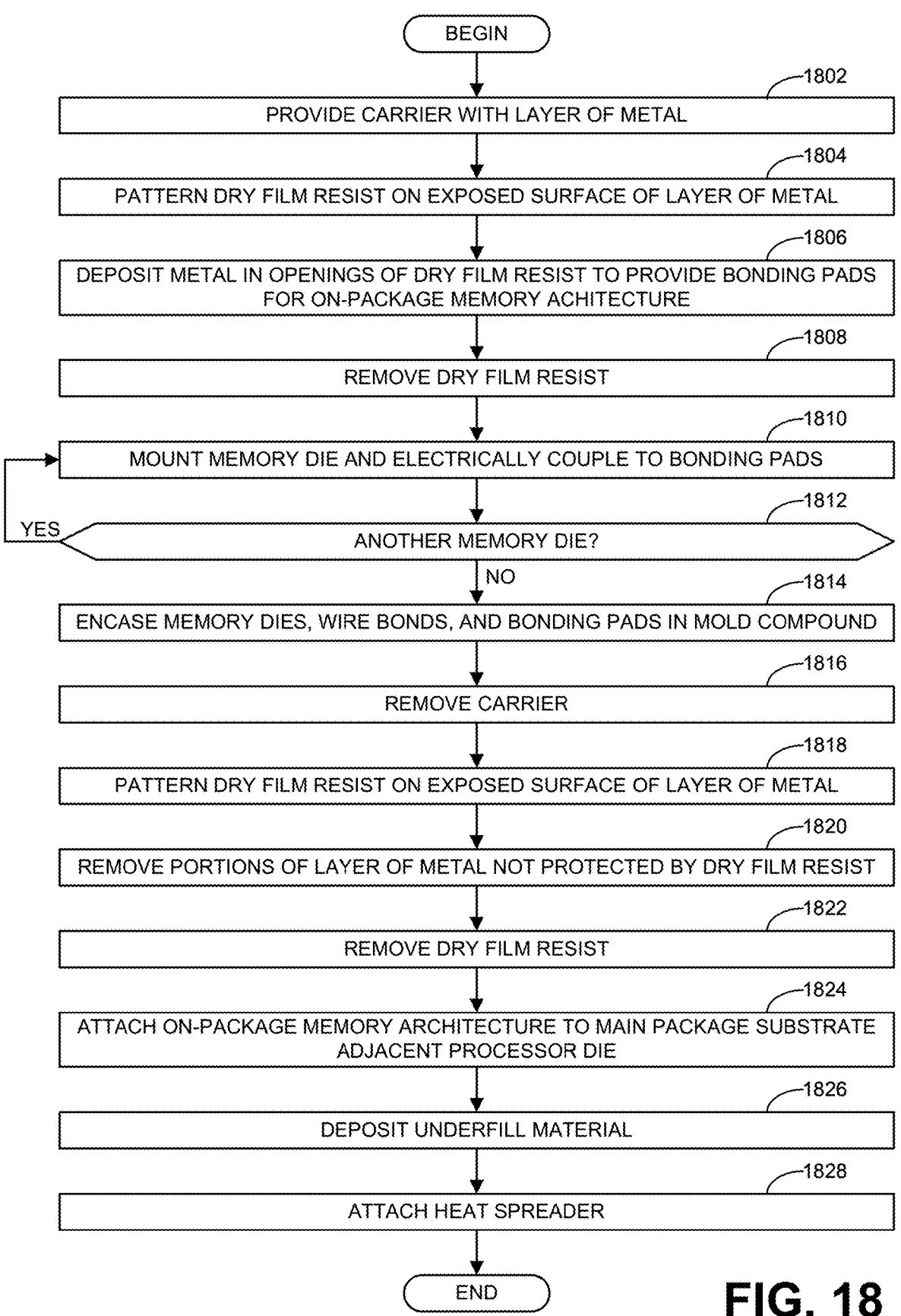

BEGIN

1802
PROVIDE CARRIER WITH LAYER OF METAL

1804
PATTERN DRY FILM RESIST ON EXPOSED SURFACE OF LAYER OF METAL

1806
DEPOSIT METAL IN OPENINGS OF DRY FILM RESIST TO PROVIDE BONDING PADS FOR ON-PACKAGE MEMORY ACHITECTURE

1808
REMOVE DRY FILM RESIST

1810
MOUNT MEMORY DIE AND ELECTRICALLY COUPLE TO BONDING PADS

1812
YES      ANOTHER MEMORY DIE?

NO
1814
ENCASE MEMORY DIES, WIRE BONDS, AND BONDING PADS IN MOLD COMPOUND

1816
REMOVE CARRIER

1818
PATTERN DRY FILM RESIST ON EXPOSED SURFACE OF LAYER OF METAL

1820
REMOVE PORTIONS OF LAYER OF METAL NOT PROTECTED BY DRY FILM RESIST

1822
REMOVE DRY FILM RESIST

1824
ATTACH ON-PACKAGE MEMORY ARCHITECTURE TO MAIN PACKAGE SUBSTRATE ADJACENT PROCESSOR DIE

1826
DEPOSIT UNDERFILL MATERIAL

1828
ATTACH HEAT SPREADER

END

FIG. 18

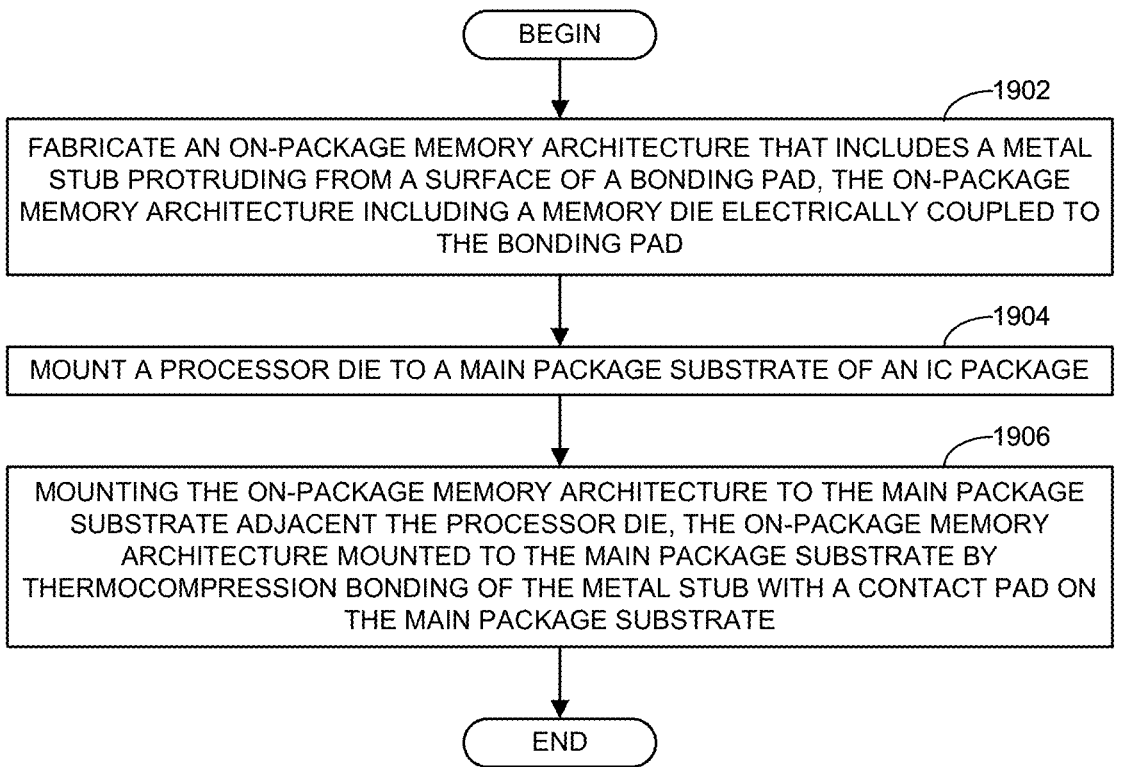

BEGIN

FABRICATE AN ON-PACKAGE MEMORY ARCHITECTURE THAT INCLUDES A METAL STUB PROTRUDING FROM A SURFACE OF A BONDING PAD, THE ON-PACKAGE MEMORY ARCHITECTURE INCLUDING A MEMORY DIE ELECTRICALLY COUPLED TO THE BONDING PAD
—1902

MOUNT A PROCESSOR DIE TO A MAIN PACKAGE SUBSTRATE OF AN IC PACKAGE
—1904

MOUNTING THE ON-PACKAGE MEMORY ARCHITECTURE TO THE MAIN PACKAGE SUBSTRATE ADJACENT THE PROCESSOR DIE, THE ON-PACKAGE MEMORY ARCHITECTURE MOUNTED TO THE MAIN PACKAGE SUBSTRATE BY THERMOCOMPRESSION BONDING OF THE METAL STUB WITH A CONTACT PAD ON THE MAIN PACKAGE SUBSTRATE
—1906

END

FIG. 19

METHODS AND APPARATUS TO REDUCE THICKNESS OF ON-PACKAGE MEMORY ARCHITECTURES

FIELD OF THE DISCLOSURE

This disclosure relates generally to integrated circuit packages and, more particularly, to methods and apparatus to reduce thickness of on-package memory architectures.

BACKGROUND

As technology advances and demands for smaller and more efficient computing devices increase, integrated circuit (IC) packages have become more complex. Many IC packages include multiple semiconductor dies or chiplets (also called tiles) that are electrically interconnected via a package substrate. In the past, memory and data storage capabilities have typically been provided in dedicated IC packages that are physically separate from IC packages that provide processing capabilities (e.g., CPU, GPU, microprocessor, etc.). However, more recently, some IC packages have been implemented with both processor dies and an on-package memory architecture.

BRIEF DESCRIPTION OF THE DRAWINGS

FIG. 18 is a flowchart illustrating an example method of manufacturing the example IC package of FIG. 4 up through the fabrication stage shown in FIG. 17.

FIG. 19 is a flowchart illustrating another example method of manufacturing the example IC package of FIG. 4.

Figure 1:
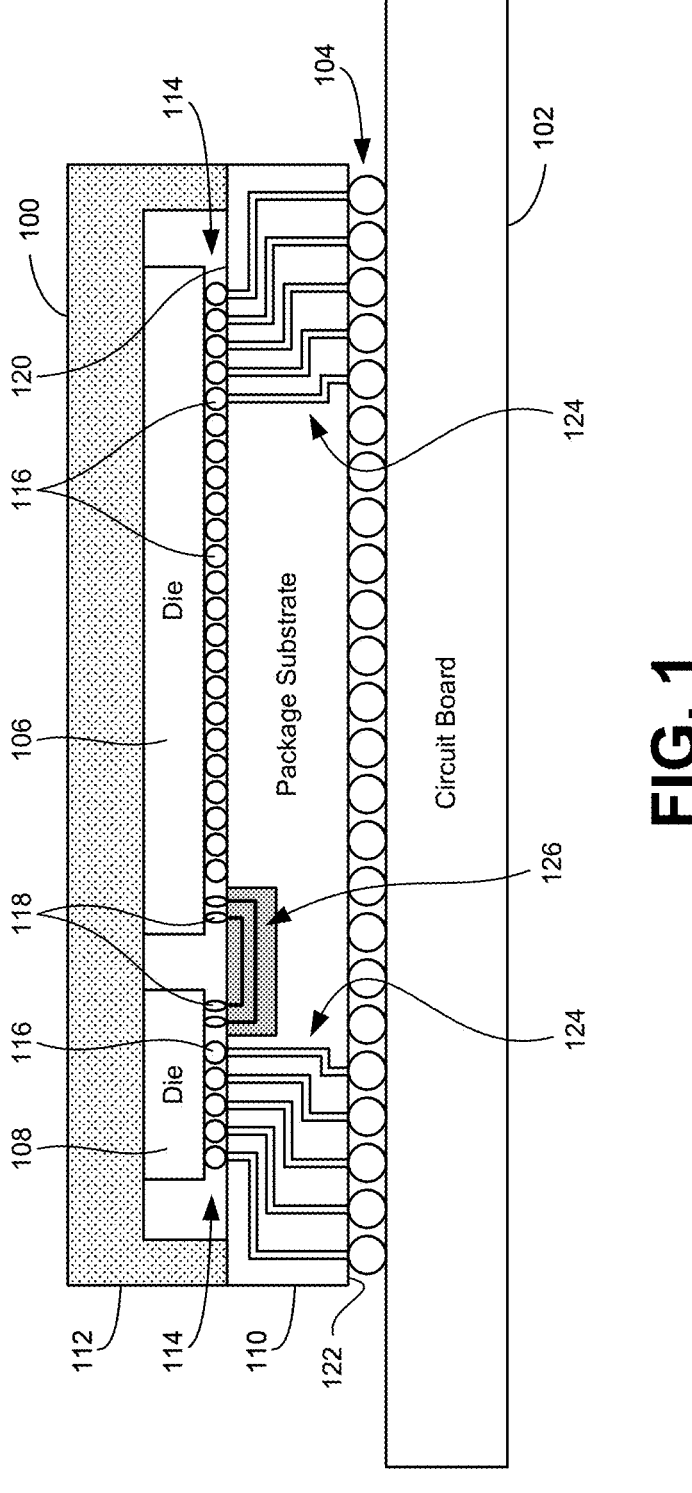
FIG. 1 illustrates an example integrated circuit (IC) package that includes two example semiconductor dies electrically coupled to a package substrate that is electrically coupled to a circuit board.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time +/−1 second.

DETAILED DESCRIPTION

FIG. 1 illustrates an example integrated circuit (IC) package 100 that is electrically coupled to a circuit board 102 via an array of bumps or balls 104 (e.g., a ball grid array (BGA)). In some examples, the IC package 100 may include pins and/or pads, in addition to or instead of the balls 104, to enable the electrical coupling of the package 100 to the circuit board 102. In this example, the package 100 includes two semiconductor (e.g., silicon) dies 106, 108 that are mounted to a package substrate 110 and enclosed by a package lid or mold compound 112. While the example IC package 100 of FIG. 1 includes two dies 106, 108, in other examples, the package 100 may have only one die or more than two dies.

As shown in the illustrated example, each of the dies 106, 108 is electrically and mechanically coupled to the package substrate 110 via corresponding arrays of bumps 114. The electrical connections between the dies 106, 108 and the package substrate 110 (e.g., the bumps 114) are sometimes referred to as first level interconnects. By contrast, the electrical connections between the IC package 100 and the circuit board 102 (e.g., the balls 104) are sometimes referred to as second level interconnects. In some examples, one or both of the dies 106, 108 may be stacked on top of one or more other dies and/or interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to bumps between a die and a package substrate or a die and an underlying die and/or interposer.

As shown in FIG. 1, the bumps 114 of the first level interconnects include two different types of bumps corresponding to core bumps 116 and bridge bumps 118. As used herein, core bumps 116 refer to bumps on the dies 106, 108 through which electrical signals pass between the dies 106, 108 and components external to the IC package 100. Thus, as shown in the illustrated example, the core bumps 116 physically connected to the inner surface 120 of the substrate 110 are electrically coupled to the balls 104 on the external surface 122 of the substrate 110 via internal interconnects or traces 124 within the substrate 110. As used herein, bridge bumps 118 refer to bumps on the dies 106, 108 through which electrical signals pass between different ones of the dies 106, 108 within the package 100. Thus, as shown in the illustrated example, the bridge bumps 118 of the first die 106 are electrically coupled to the bridge bumps 118 of the second die 108 via an interconnect bridge 126 embedded in the package substrate 110. As represented in FIG. 1, core bumps 116 are typically larger than bridge bumps 118.

In some instances, an IC package (that includes one or more dies on a package substrate) may be included within a larger IC package that includes one or more additional dies (and/or other relatively small IC packages) mounted on a larger package substrate. For instance, in some examples, a processor die and a separate package that provide memory for the processor die can be mounted to a common substrate of a larger package. Implementing memory and processing functionalities in a single package provides improvements to the power requirements and performance of such a system relative to a system in which memory is implemented in a dedicated package distinct from the processor. More particularly, on-package memory offers a lower watt/byte ratio compared to on-board memory. Such improvements are achieved because of the shorter trace lengths between the memory and processor components made possible by positioning memory architectures in close proximity to processor dies within a single package. Further, combining both processing and memory functionalities into a single package can reduce the overall footprint of the single package relative to the combined footprint of two separate packages.

Figure 2:
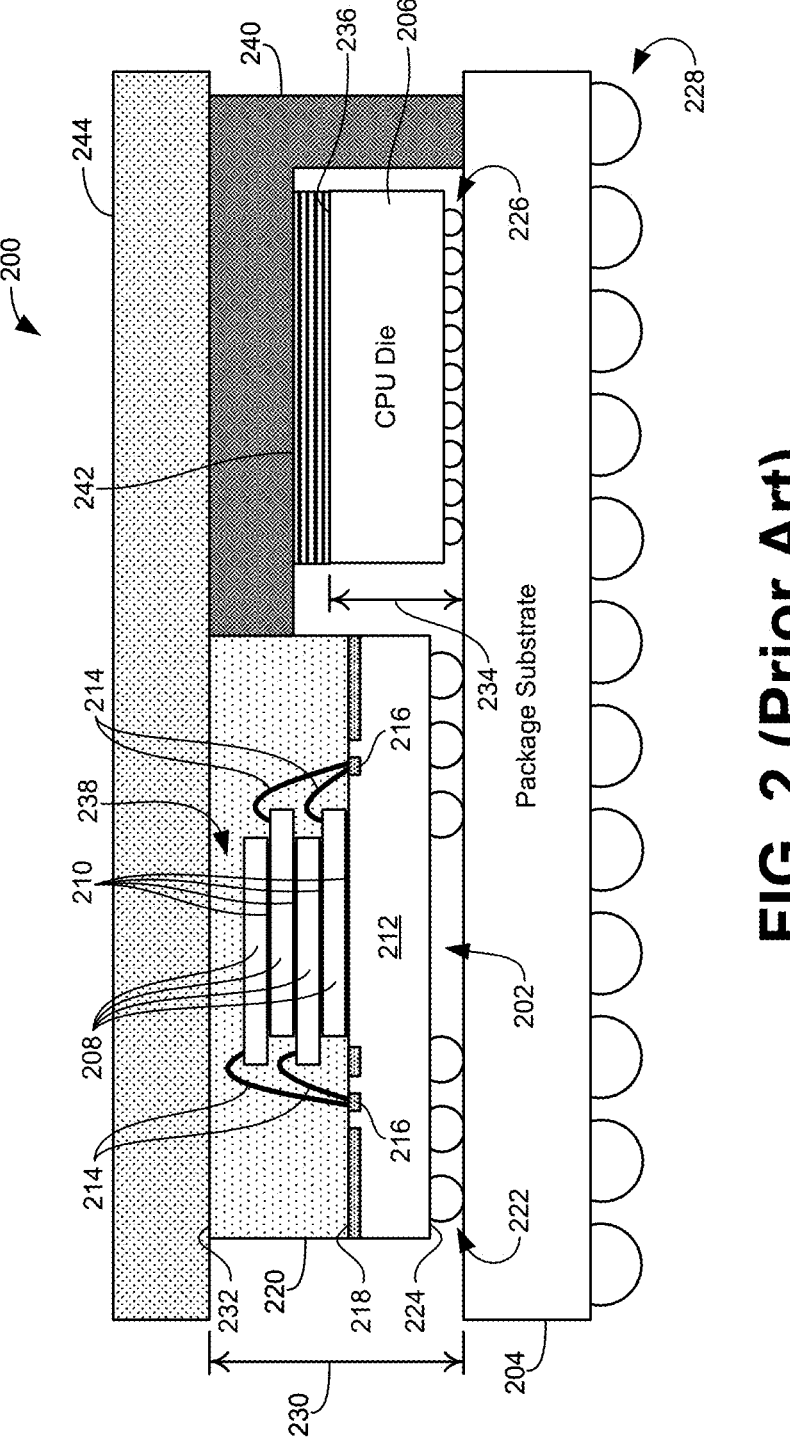
FIG. 2 illustrates an IC package that includes a known on-package memory architecture.

FIG. 2 illustrates a known IC package 200 that includes an on-package memory architecture 202 mounted on a package substrate 204 adjacent a separate processor die 206 (e.g., a CPU). As shown in FIG. 2, the on-package memory architecture 202 is itself an IC package that includes a plurality of memory dies 208 mounted to a corresponding package substrate 212. The memory dies 208 implement dynamic random-access memory (DRAM). For purposes of explanation, the package substrate 212 of the on-package memory architecture 202 is referred to as the memory package substrate 212, whereas the package substrate 204 of the main IC package 200 of FIG. 2 is referred to herein as the main package substrate 204. The memory dies 208 are stacked on top of one another with each die 208 affixed to the underlying surface (either the memory package substrate 212 or a previously stacked die 208) with a die attach film 210 (e.g., an epoxy adhesive). Further, the memory dies 208 of FIG. 2 are electrically connected to the package substrate 212 via wire bonds 214 that extend from individual ones of the dies 208 to bonding pads 216 on an inner (e.g., top) surface 218 of the memory package substrate 212. A mold compound 220 encases and/or encapsulates the memory dies 208 and the wire bonds 214. In some instances, as shown in FIG. 2, more than one wire bond 214 is electrically connected to a single bonding pad 216. However, in other instances, different ones of the wire bonds 214 are electrically coupled to different bonding pads 216. The bonding pads 216 are, in turn, electrically coupled to corresponding bumps or balls 222 (e.g., a BGA) on an exterior (e.g., bottom) surface 224 of the memory package substrate 212 via internal interconnects within the substrate 212 similar to the interconnects 124 described above in connection with FIG. 1.

The balls 222 on the exterior surface 224 of the memory package substrate 212 serve as second level interconnects to electrically (and mechanically) connect the on-package memory architecture 202 to the main package substrate 204 in a similar manner that the dies 106, 108 connect to the package substrate 110 of FIG. 1. Likewise, the processor die 206 of FIG. 2 includes bumps or balls 226 (e.g., a BGA) to electrically and mechanically connect the processor die 206 to the main package substrate 204. As with the package substrate 110 of FIG. 1, the main package substrate 204 of the IC package 200 of FIG. 2 includes external bumps or balls 228 (e.g., a BGA) to enable the IC package 200 to be electrically and mechanically mounted to a circuit board. Further, the main package substrate 204 includes internal traces and vias that define interconnects between the on-package memory architecture 202 and the external balls 228, between the processor die 206 and the external balls 228, and/or between the on-package memory architecture 202 and the processor die 206.

As shown in FIG. 2, the on-package memory architecture 202 has an overall thickness 230 (also referred to as a z-height) from the bottom of the balls 222 to an upper (exterior) surface 232 of the mold compound 220 that is significantly larger than the overall thickness (or z-height) 234 of the processor die 206 (as measured from the bottom of the balls 226 to the top surface 236 of the processor die 206). One factor contributing to the relatively large thickness 230 of the on-package memory architecture 202 includes the stack of memory dies 208 included in the architecture 202. The more memory dies 208 that are included in the die stack, the greater the overall thickness 230 of the on-package memory architecture 202. While FIG. 2 shows four memory dies, fewer or more (e.g., 2, 6, 8, etc.) dies 208 may be included in the architecture 202. Depending on the number of memory dies 208, the overall thickness 230 of the on-package memory architecture 202 can be more than twice the thickness 234 of the processor die 206. For instance, some on-package memory architectures 200 with eight memory dies can have an overall thickness 230 of approximately 880 micrometers (μm) whereas a processor die 206 can have a thickness 234 of approximately 355 μm for a difference of approximately 525 μm. An on-package memory architecture 202 with four memory dies 208 can have a thickness 230 of approximately 660 μm, which is still 305 μm taller than the thickness 234 of the processor die 206.

Apart from the memory dies 208, a significant portion of the thickness 230 of the on-package memory architecture 202 is attributed to the memory package substrate 212 and the balls 222. The size or thickness of the memory package substrate 212 and the balls 222 is at least partially driven by the size of the memory dies 208. That is, as the memory dies 208 get larger (in footprint) the thickness of the substrate 212 and the balls 222 need to increase to mitigate against an increased risk of warpage. Further, the nature in which the memory dies 208 are electrically coupled to the memory package substrate 212 can define the number of metal layers within the substrate 212 needed to redistribute signals from the memory dies 208 to the balls 222. Thus, while a redesign of the memory dies 208 could potentially eliminate the need for some metal layers in the memory package substrate 212, the resulting reduction in thickness is not going to be sufficient to overcome the large difference between the overall thickness 230 of the on-package memory architecture 202 and the processor die 206. Moreover, such a redesign of the memory dies 208 can be cost prohibitive and/or be prevented by other design constraints.

The remaining portion of the on-package memory architecture 202 that contributes to the overall thickness 230 of the architecture 202 is the overmold portion 238. The overmold portion 238 corresponds to the portion of the mold compound 220 that extend from the upper surface of the uppermost memory die 208 up to the upper surface 232 of the mold compound 220. Typically, the overmold portion 238 has a thickness of approximately 120 μm, which cannot be significantly reduced without reducing the protection provided to the memory dies 208 and the wire bonds 214, thereby giving rise to reliability issues.

The relatively large difference in the z-height between the on-package memory architecture 202 and the processor die 206 creates challenges for dissipating heat from the different components. In particular, the uneven heights between the different components prevents a simple integrated heat spreader with a planar (e.g., flat) surface from being attached across the upper surface of the components. Rather, as shown in FIG. 2, an integrated heat spreader 240 is implemented with a pedestal design to extend from the main package substrate 204 up to the z-height 230 of the on-package memory architecture 202. Further, as shown in FIG. 2, the integrated heat spreader 240 extends over the top surface 236 of the processor die 206 and is connected thereto via a thermal interface material (TIM) 242. The combined thickness of the integrated heat spreader 240 and the TIM 242 makes up the difference between the overall thickness 230 of the on-package memory architecture 202 and the processor die 206. As a result, a planar (e.g., flat) heat spreader 244 can be positioned across the entire assembly as shown in FIG. 2. The implementation of the integrated heat spreader 240 to fill the gap between the processor die 206 and the flat heat spreader 244 that extends across the top of the IC package 200 introduces additional components and associated fabrication processes that add to the complexity and associated cost of the IC package 200.

Figure 3:
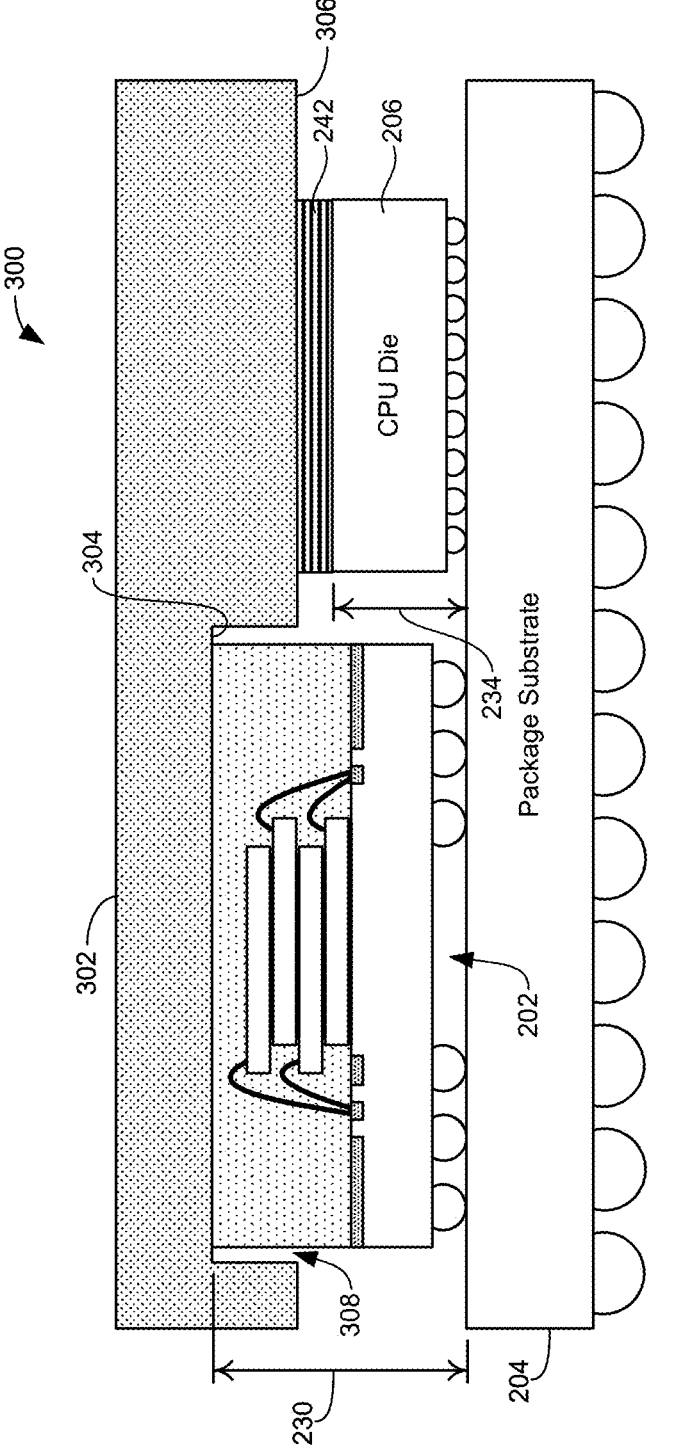
FIG. 3 illustrates another IC package that includes the known on-package memory architecture of FIG. 2.

An alternative approach to providing for the dissipation of heat away from the on-package memory architecture 202 and the processor die 206 is through the use of a non-planar (e.g., non-flat) heat spreader as shown in FIG. 3. Specifically, FIG. 3 illustrates a known IC package 300 that includes the same on-package memory architecture 202 and the same processor die 206 mounted to the same main package substrate 204 as shown and described above in connection with FIG. 2. However, unlike the IC package 200 of FIG. 2, the IC package 300 of FIG. 3 includes a non-flat (e.g., non-planar) heat spreader 302. More particularly, the heat spreader 302 of FIG. 3 is non-flat because it includes separate surfaces 304, 306 facing in the same direction but that are offset relative to one another based on the difference in the z-heights 230, 234 of the on-package memory architecture 202 and the processor die 206. That is, the heat spreader 302 of FIG. 3 includes an opening or recess 308 that is dimensioned to fit the on-package memory architecture 202 such that the recessed surface 304 (associated with the opening) can be positioned adjacent the upper surface of the on-package memory architecture 202 while the outer surface 306 is positioned adjacent the upper surface of the processor die 206. In FIG. 3, the outer surface is not directly against the processor die 206 but is dimensioned to be close enough so that the difference can be made up by the TIM 242. While the IC package 300 of FIG. 3 does not need the additional integrated heat spreader 240 shown and described in FIG. 2, the design of the heat spreader 302 of FIG. 3 with the opening 308 involves complex and costly fabrication processes.

Figure 4:
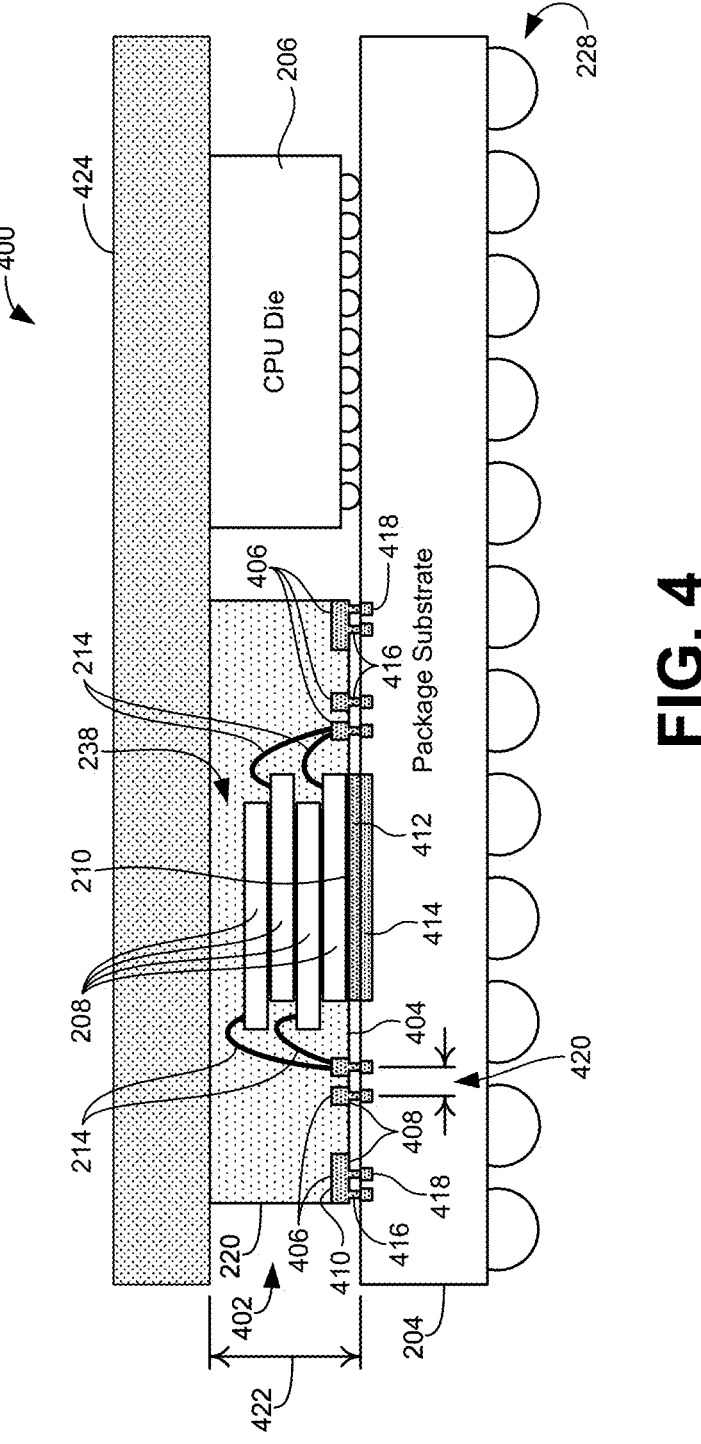
FIG. 4 illustrates an example IC package that includes an on-package memory architecture constructed in accordance with teachings disclosed herein.

Examples disclosed herein overcome the problems arising from the uneven heights between the on-package memory architecture 202 and the processor die 206 shown in FIGS. 2 and 3. More particularly, FIG. 4 illustrates an example IC package 400 that includes an on-package memory architecture 402 constructed in accordance with teachings disclosed herein. Unlike the on-package memory architecture 202 of FIGS. 2 and 3, the on-package memory architecture 402 of FIG. 4 does not include a dedicated package substrate (e.g., the memory package substrate 212 of FIGS. 2 and 3) and does not include BGA balls (e.g., the balls 222 in FIGS. 2 and 3). Rather, the exposed bottom surface 404 of the on-package memory architecture 402 corresponds to a bottom surface of the mold compound 220 that surrounds and encases the memory dies 208 and wire bonds 214. Further, as shown in the illustrated example, the bottom surface 404 of the mold compound 220 can be much closer to the top surface of the main package substrate that would otherwise be possible if the memory package substrate was retained. More particularly, in some examples, the bottom surface 404 of the mold compound 220 is less than 50 μm (e.g., 25 μm, 30 μm, 35 μm, 40 μm, etc.) from the top surface of the main package substrate 204.

In some examples, as shown in FIG. 4, bonding pads 406 to which the wire bonds 214 are electrically coupled are also encapsulated by the mold compound 220. That is, unlike the bonding pads 216 of FIGS. 2 and 3 that protrude away from the mold compound 220, the bonding pads 406 of FIG. 4 protrude into the mold compound 220 with exterior (e.g., bottom) surfaces 408 that are generally flush with the exposed bottom surface 404 of the mold compound 220 and interior (e.g., top) surfaces 410 that are inset relative to the exposed bottom surface 404 of the mold compound 220. While the bottom surface of the bonding pads 406 may be exposed, the mold compound 220 at least encapsulates side walls of the bonding pads extending between the top and bottom surfaces of the bonding pads 406. In this example, the on-package memory architecture 202 is coupled to the main package substrate 204 without a memory package substrate between the bonding pads 406 and the main package substrate 204.

In some examples, the bottommost memory die 208 is positioned adjacent the bottom surface 404 of the mold compound 220 such that the bottommost memory die 208 is positioned laterally between different ones of the bonding pads 406 such that the bottommost memory die 208 and the adjacent bonding pads 406 all lie within a common plane. Thus, a bottom surface of the bottommost memory die 208 is closer to the bottom surface 404 of the mold compound 220 than the interior (top) surfaces 410 of the bonding pads 406. In some examples, the exterior (bottom) surfaces 408 of the bonding pads 406 are approximately flush with the bottom surface of the bottommost memory die 208. However, the memory die 208 may be offset relative to the exterior surfaces 408 of the bonding pads 406 by some extent corresponding to a thickness of a die attach film 210 on the underside of the memory die 208. More particularly, in some examples, the bottommost memory die 208 is affixed to a metal (e.g., copper) plate 412 that facilitates the dissipation of heat from the stack of memory dies 208. In some examples, the metal plate 412 is dimensioned to engage with a correspond metal plate 414 in the main package substrate 204. In some examples, the metal plate 412 may be omitted. In some such examples, the bottom surface of the bottommost memory die 208 is exposed adjacent the bottom surface 404 of the mold compound 220. However, as discussed below, in some examples, the gap between the bottom surface of the mold compound 220 and the top surface of the main package substrate 204 may be filled with an underfill material.

As shown in the illustrated example, metal (e.g., copper) stubs 416 are in contact with and/or protrude directly from the exterior (bottom) surface 408 of the bonding pads. That is, in some examples, the bonding pads 406 and the protruding stubs 416 correspond to a unitary and continuous metal structure. The protruding stubs 416 serve as the first level interconnects that enable the on-package memory architecture 402 of FIG. 4 to be electrically (and mechanically) coupled to the main package substrate 204. That is, the stubs 416 are electrically coupled to corresponding contact pads 418 on the upper surface of the package substrate 204. In some examples, the stubs 416 and the corresponding contact pads 418 are positioned with a spacing or pitch 420 corresponding to the fine line pitch of typical system-on-a-chip (SOC) first level interconnects (e.g., a pitch less than or equal to approximately 110 μm). The contact pads 418 on the package substrate 204 are electrically coupled to metal interconnects within the substrate 204 to electrically connect with the processor die 206 and/or the balls 228 on the opposite side of the package substrate 204 as described above in connection with FIG. 1. In some examples, as shown in FIG. 4, the metal plate 412 and the stubs 416 are aligned within a common plane.

As described above in connection with FIGS. 2 and 3, the z-height of the memory package substrate 212 can be around 120 μm and the z-height of the balls 212 can be around 200 μm. These z-heights combined with a thickness of the memory die stack and the overmold portion 238 of approximately 340 μm (for a four die stack) results in an overall thickness 230 of approximately 660 μm for the on-package memory architecture 220 of FIGS. 2 and 3. By eliminating the memory package substrate 212 and the balls 212, the overall thickness 422 of the on-package memory architecture 400 of FIG. 4 is reduced to approximately 375 μm, which includes the 340 μm for the memory die stack and the overmold portion 238 plus an additional 35 μm for the stubs 416. An overall thickness 422 of approximately 375 μm is nearly on par with the approximately 355 μm thickness for the processor die 206 as discussed above. That is, the difference in thickness of the two components is relatively small and approximately the same (e.g., within 20 μm). In some examples, this much smaller difference can reduced even further (e.g., less than 15 μm, less than 10 μm, less than 5 μm, etc.) or eliminated entirely by relatively small reductions in the thickness of the memory dies 208, the overmold portion 238, and/or the stubs 416. Additionally or alternatively, excess material can be included in the fabrication of the processor die 206 to increase its thickness until it is approximately the same as the on-package memory architecture 402 as shown in FIG. 4. With the thicknesses of the on-package memory architecture 402 and the processor die 206 being substantially the same, a substantially planar or flat heat spreader 424 can be positioned directly across the top of both the on-package memory architecture 402 and the processor die 206 without the need for a separate integrated heat spreader 240 to make up the difference (as in FIG. 2) and without the need to fabricate a heat spreader with a recessed surface to provide room for height differences (as in FIG. 3).

The elimination of the memory package substrate 212 (and the associated balls 222) not only significantly reduces the overall thickness of the on-package memory architecture 402, but also improves the processor and/or power efficiency of the system. In particular, eliminating the memory package substrate 212 eliminates the double data rate (DDR) routing through the memory package substrate thereby reducing the length of the signal path along which signals must pass between the on-package memory architecture 402 and the adjacent processor die 206.

Figures 5, 6, 7, 8, 9:
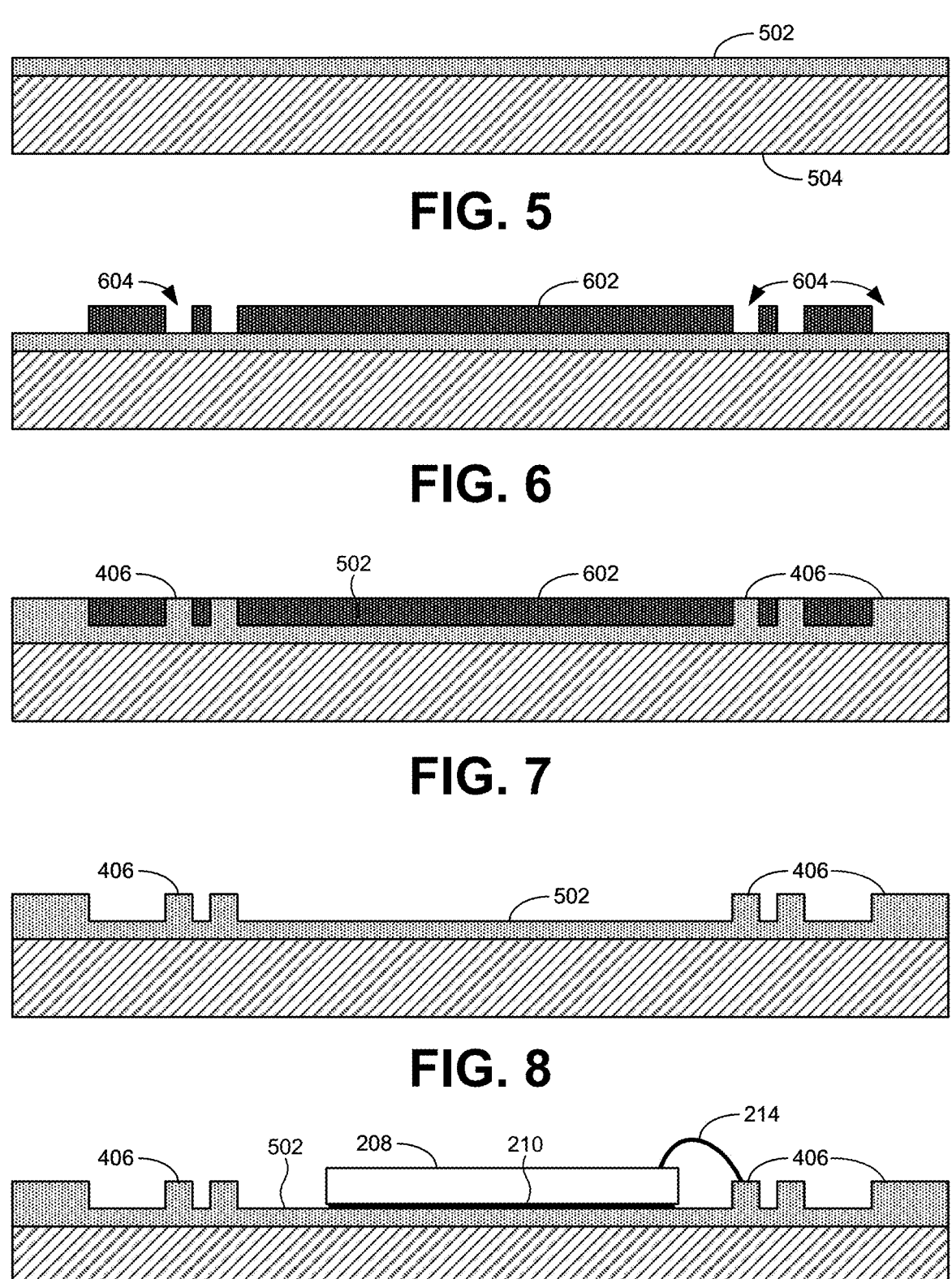
FIGS. 5-17 illustrate various stages in the fabrication process of the example IC package of FIG. 4.

FIGS. 5-17 illustrate various stages in the fabrication process of the example IC package of FIG. 4. FIG. 5 represents a layer of metal 502 on a carrier 504. In some examples, the layer of metal 502 is copper foil. In some examples, as discussed further below, the layer of metal 502 serves as the basis for the copper stubs 416 that protrude from bonding pads 406. Accordingly, in some examples, the thickness (or z-height) of the layer of metal 502 is selected based on an intended thickness of the stubs 416. FIG. 6 represents a dry film resist 602 that has been deposited on the layer of metal 502 and lithographically patterned to produce openings 604. In this example, the opening 604 are dimensioned and positioned to define locations of the bonding pads 406. FIG. 7 represents metal being deposited (e.g., via electrolytic plating) into the openings 604 to produce metal protrusions extending upwards from the layer of metal 502. The metal protrusions correspond to the bonding pads 406 shown and described above in connection with FIG. 4. In this example, the metal being deposited for the protrusions 702 is the same as the metal used in the initial layer of metal 502 (e.g., copper), thereby producing a continuous extension of the metal. FIG. 8 represents the stage of the fabrication process following removal of the dry film resist 602.

Figure 10:
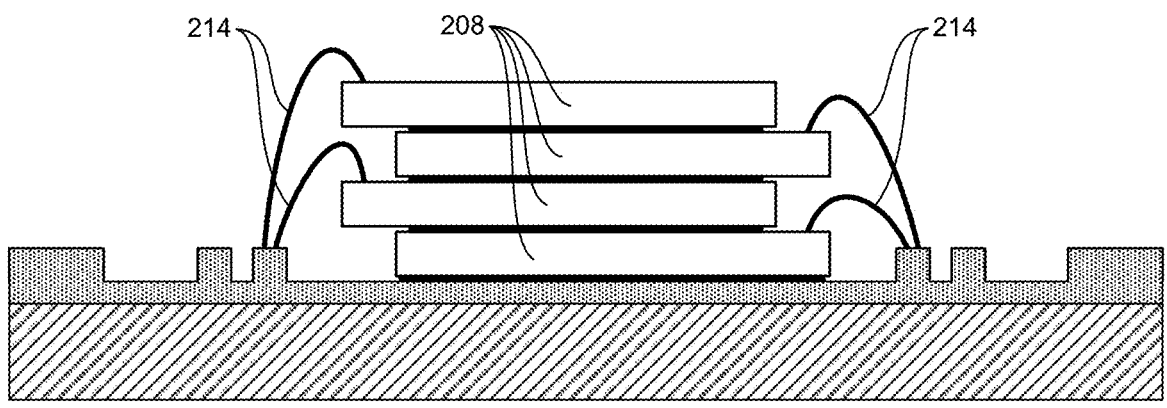
Figure 11:
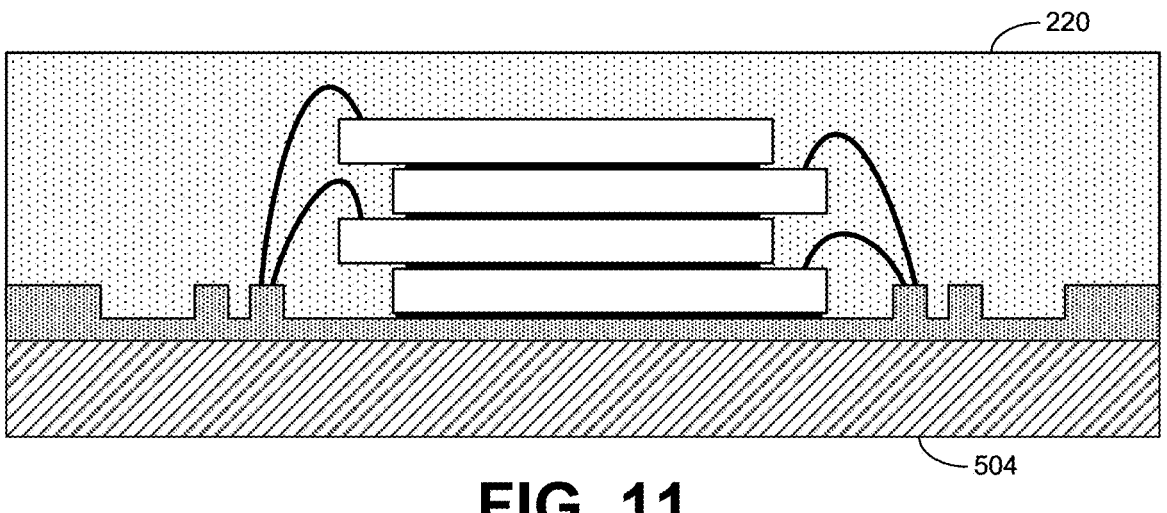
Figure 12:
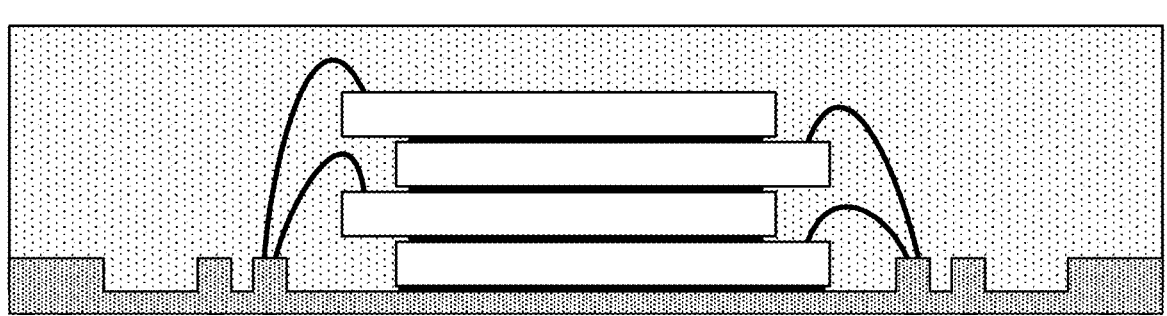

FIG. 9 represents the mounting and electrical coupling of a first one of the memory dies 208. In particular, as shown in the illustrated example, the memory die 208 is mounted to the underlying metal layer 502 using a die attach film 210. Further, the memory die 208 is electrically coupled to the bonding pads 406 via a wire bond 214. While only one wire bond 214 is shown, in some examples, multiple wire bonds 214 may be implemented to electrically couple the memory die 208 to one or more different bonding pads 406. FIG. 10 represents the stage in the fabrication process after all four memory dies 208 have been mounted on top of one another and separately connected to bonding pads 406 via corresponding wire bonds 214. FIG. 11 represents the memory dies 208, the wire bonds 214, and the associated bonding pads 406 being encapsulated and/or encased in the molding compound 220. FIG. 12 represents the removal of the carrier 504.

Figure 13:
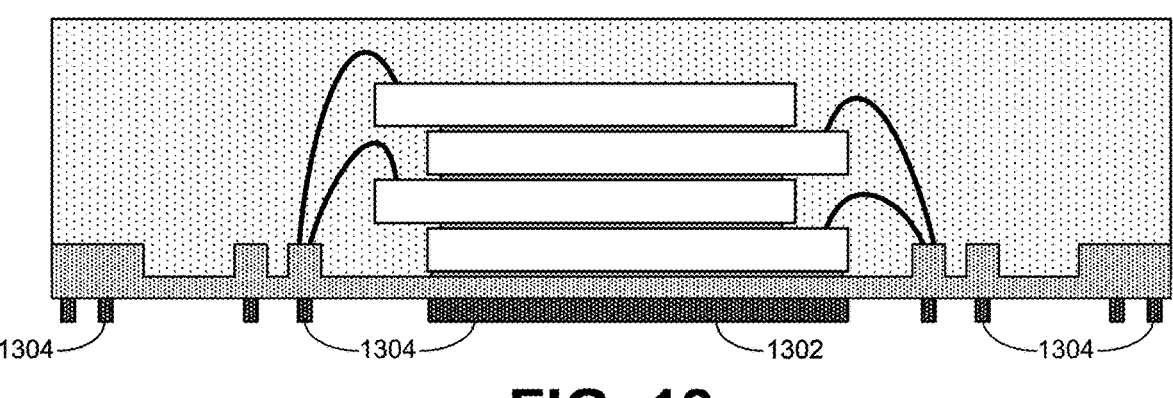
Figure 14:
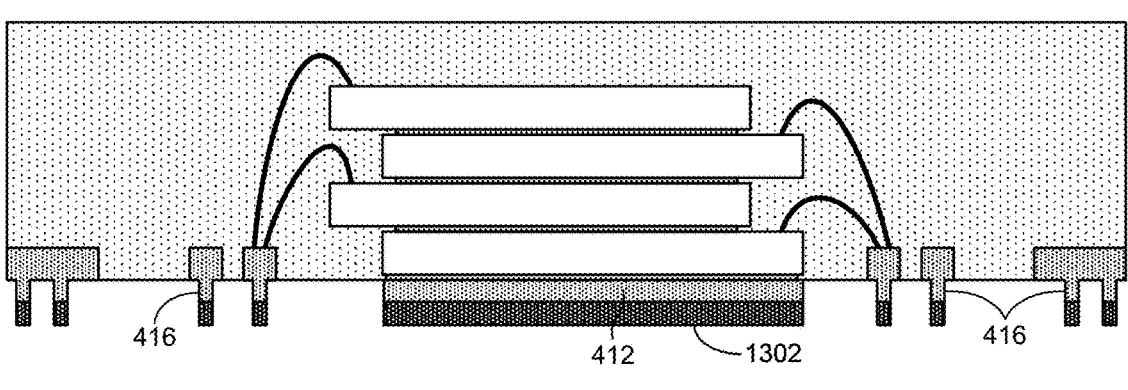
Figure 15:
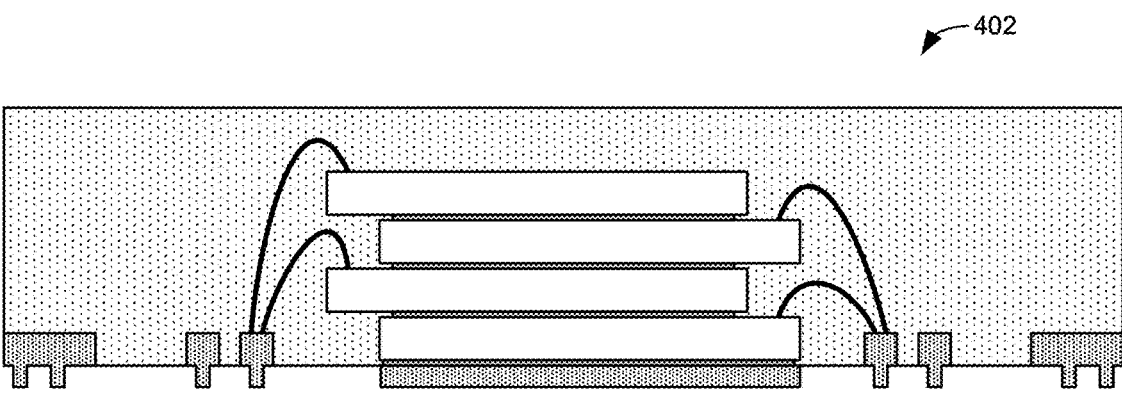

FIG. 13 represents the stage of the fabrication process in which a dry film resist 1302 that has been deposited on the layer of metal 502 and lithographically patterned to define protective protrusions 1304. In this example, the dry film resist is deposited on the surface of the layer of metal 502 that is opposite the memory dies 208, the bonding pads 406, and the wire bonds 214. In some examples, the protective protrusions 1304 defines regions of the layer of metal 502 that is to be retained after an etching process represented by the stage of fabrication shown in FIG. 14. In particular, as shown in FIG. 14, the portions of the layer of metal 502 that are retained following the etching process include the copper stubs 416 and the copper plate 412. FIG. 15 represents the removal of the dry film resist 1302 and the final structure of the on-package memory architecture 402 of FIG. 4. That is, once the on-package memory architecture 402 has been constructed to the stage represented in FIG. 15, the on-package memory architecture 402 is ready to be attached to the main package substrate 204.

Figure 16:
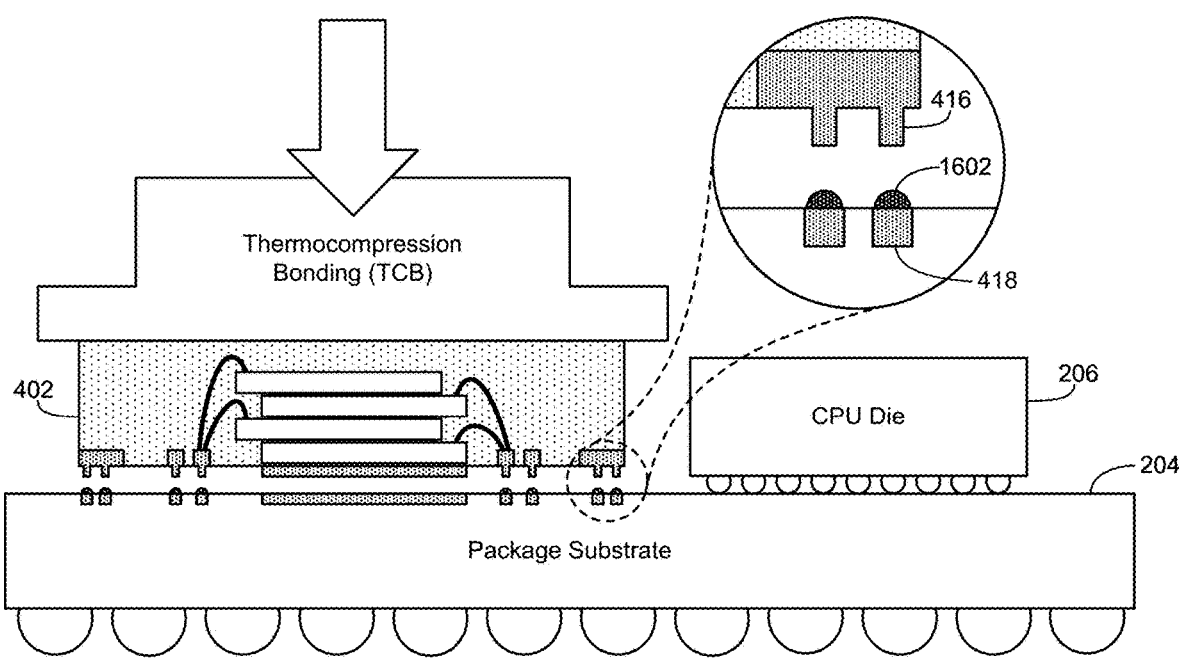
Figure 17:
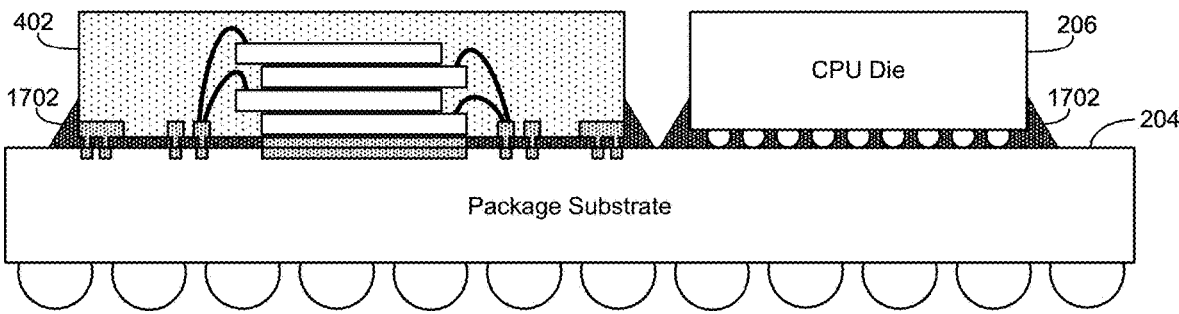

FIG. 16 represents the thermocompression bonding (TCB) process that is implemented to attach the on-package memory architecture 402 of FIG. 15 to the main package substrate 204. As shown in the enlarged insert in FIG. 16, the contact pads 418 on the top surface of include microballs 1602 of solder material to facilitate the attachment of the copper stubs 416 to the contact pads 418. In some examples, the microballs 1602 include tin (Sn), silver (Ag), and copper (Cu). FIG. 17 represents the addition of an underfill material 1702 within the gaps between the on-package memory architecture 402 and the main package substrate 204 and/or between the processor die 206 and the main package substrate 204. The underfill material 1702 can help protect the reliability of the solder joints. With both the on-package memory architecture 402 and the processor die 206 attached to the main package substrate 204 and both being approximately the same thickness, it is possible to attach a planar (e.g., flat) head spreader 424 across the upper surface of both components as shown and described above in connection with FIG. 4.

FIG. 18 is a flowchart illustrating an example method of manufacturing the example IC package 400 of FIG. 4 in accordance with the fabrication process stages represented in FIGS. 5-17. Although the example method of manufacture is described with reference to the flowchart illustrated in FIG. 18, many other methods may alternatively be used. For example, the order of execution of the blocks may be changed, and/or some of the blocks described may be combined, divided, re-arranged, omitted, eliminated, and/or implemented in any other way.

The example process begins at block 1802 by providing a carrier 504 with a layer of metal 502 (as shown in FIG. 5). At block 1804, the example fabrication process includes patterning a dry film resist 602 on an exposed surface of the layer of metal 502 (as shown in FIG. 6). At block 1806, the example fabrication process includes depositing (e.g., via electrolytic plating) metal in openings 604 in the dry film resist 602 to provide bonding pads 406 for the on-package memory architecture 402 (as shown in FIG. 7). At block 1808, the example fabrication process includes removing the dry film resist 602 (as shown in FIG. 8). At block 1810, the example fabrication process includes mounting a memory die 208 and electrically coupling it to the bonding pads (as shown in FIG. 9). At block 1812, the example fabrication process includes determining whether there is another memory die 208 to include. If so, the process returns to block 1810 to add additional memory dies 208 (as shown in FIG. 10).

If no further memory dies 208 are to be added, the example fabrication process advances to block 1814 where the memory dies 208, the wire bonds 214, and the bonding pads 406 are encases in the mold compound 220 (as shown in FIG. 11). At block 1816, the example fabrication process includes removing the carrier 504 (as shown in FIG. 12). At block 1818, the example fabrication process includes patterning a dry film resist 1302 on the exposed surface of the layer of metal 502 (as shown in FIG. 13). Notably, the exposed surface of the layer of metal 502 at block 1818 is opposite the exposed surface of the layer of metal 502 to which the dry film resist 602 was added at block 1804. At block 1820, the example fabrication process includes removing (e.g., by etching) portions of the layer of metal 502 not protected by the dry film resist 1302 (as shown in FIG. 14). At block 1822, the example fabrication process includes removing the dry film resist 1302 (as shown in FIG. 15). The conclusion of block 1822 concludes the process to fabricate the on-package memory architecture 402.

At block 1824, the example fabrication process includes attaching the on-package memory architecture 402 to the main package substrate 204 adjacent a processor die 206 (as shown in FIG. 16). In some examples, the on-package memory architecture 402 can be attached before the processor die 206 is attached. In other examples, the processor die 206 is attached first. At block 1824, the example fabrication process includes depositing an underfill material (as shown in FIG. 17). At block 1828, the example fabrication process includes attaching the heat spreader 424 to arrive at the final IC package 400 (as shown in FIG. 4). Thereafter, the example process of FIG. 18 ends.

FIG. 19 is a flowchart illustrating another example method of manufacturing the example IC package 400 of FIG. 4. The example method of FIG. 19 provides a more general process flow that may be implemented in combination with the more detailed process flow described above in connection with FIG. 18. Although the example method of manufacture is described with reference to the flowchart illustrated in FIG. 19, many other methods may alternatively be used. For example, the order of execution of the blocks may be changed, and/or some of the blocks described may be combined, divided, re-arranged, omitted, eliminated, and/or implemented in any other way.

The example process begins at block 1902 by fabricating an on-package memory architecture 402 that includes a metal stub 416 protruding from a surface 408 of a bonding pad 406, the on-package memory architecture 402 including a memory die 208 electrically coupled to the bonding pad 406. At block 1904, the example fabrication process includes mounting a processor die 206 to a main package substrate 204 of an IC package 400. At block 1906, the fabrication process includes mounting the on-package memory architecture 402 to the main package substrate 204 adjacent the processor die 206, the on-package memory architecture 402 mounted to the main package substrate 204 by thermocompression bonding of the metal stub 416 with a contact pad 418 on the main package substrate 204. Thereafter, the example process ends.

The example IC package 400 disclosed herein may be included in any suitable electronic component. FIGS. 19-23 illustrate various examples of apparatus that may include or be included in the IC package 400 disclosed herein.

Figure 20:
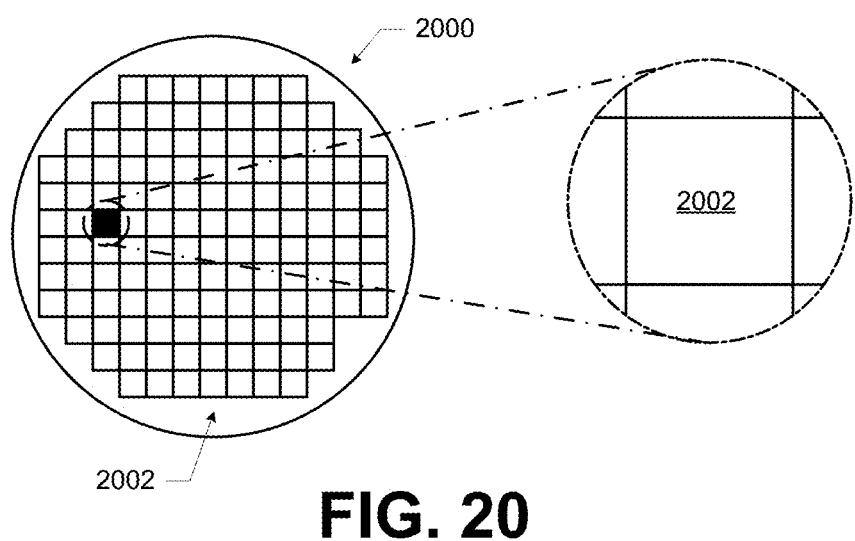
FIG. 20 is a top view of a wafer and dies that may be included in an IC package constructed in accordance with teachings disclosed herein.

FIG. 20 is a top view of a wafer 2000 and dies 2002 that may be included in the IC package 400 of FIG. 4 (e.g., as any suitable ones of the memory dies 208 or the processor die 206). The wafer 2000 may be composed of semiconductor material and may include one or more dies 2002 having IC structures formed on a surface of the wafer 2000. Each of the dies 2002 may be a repeating unit of a semiconductor product that includes any suitable IC. After the fabrication of the semiconductor product is complete, the wafer 2000 may undergo a singulation process in which the dies 2002 are separated from one another to provide discrete "chips" of the semiconductor product. The die 2002 may include one or more transistors (e.g., some of the transistors 2140 of FIG. 21, discussed below), supporting circuitry to route electrical signals to the transistors, passive components (e.g., signal traces, resistors, capacitors, or inductors), and/or any other IC components. In some examples, the wafer 2000 or the die 2002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2302 of FIG. 23) or other logic that is configured to store information in the memory devices or execute instructions stored in the memory array. The example IC package 400 disclosed herein may be manufactured using a die-to-wafer assembly technique in which some dies 206, 208 are attached to a wafer 2000 that include others of the dies 206, 208, and the wafer 2000 is subsequently singulated.

Figure 21:
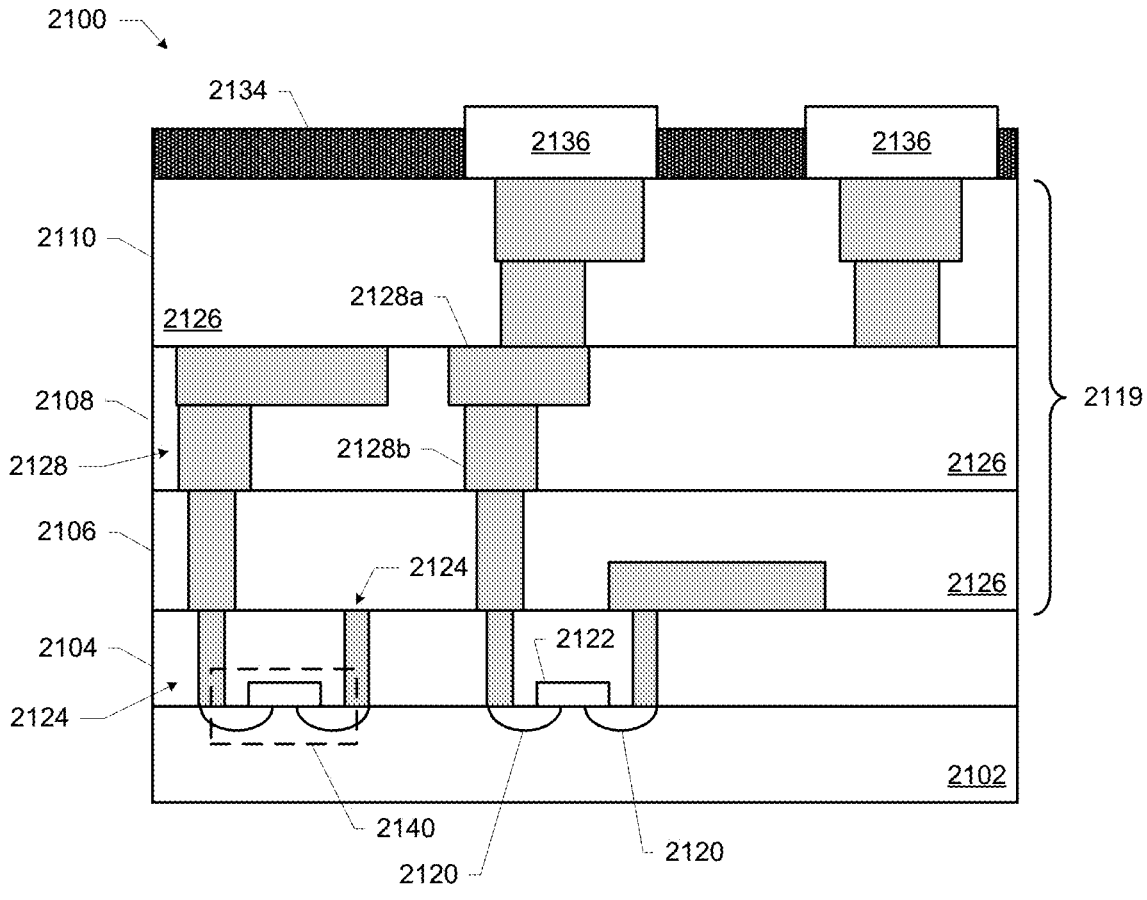
FIG. 21 is a cross-sectional side view of an IC device that may be included in an IC package constructed in accordance with teachings disclosed herein.

FIG. 21 is a cross-sectional side view of an IC device 2100 that may be included in the example IC package 400 (e.g., in any one of the dies 206, 208). One or more of the IC devices 2100 may be included in one or more dies 2002 (FIG. 20). The IC device 2100 may be formed on a die substrate 2102 (e.g., the wafer 2000 of FIG. 20) and may be included in a die (e.g., the die 2002 of FIG. 20). The die substrate 2102 may be a semiconductor substrate composed of semiconductor material systems including, for example, n-type or p-type materials systems (or a combination of both). The die substrate 2102 may include, for example, a crystalline substrate formed using a bulk silicon or a silicon-on-insulator (SOI) substructure. In some examples, the die substrate 2102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 2102. Although a few examples of materials from which the die substrate 2102 may be formed are described here, any material that may serve as a foundation for an IC device 2100 may be used. The die substrate 2102 may be part of a singulated die (e.g., the dies 2002 of FIG. 20) or a wafer (e.g., the wafer 2000 of FIG. 20).

The IC device 2100 may include one or more device layers 2104 disposed on the die substrate 2102. The device layer 2104 may include features of one or more transistors 2140 (e.g., metal oxide semiconductor field-effect transistors (MOSFETs)) formed on the die substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like. The transistors 2140 are not limited to the type and configuration depicted in FIG. 21 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2140 may include a gate 2122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2140 along the source-channel-drain direction, the gate electrode may consist of a U-shaped structure that includes a bottom portion substantially parallel to the surface of the die substrate 2102 and two sidewall portions that are substantially perpendicular to the top surface of the die substrate 2102. In other examples, at least one of the metal layers that form the gate electrode may simply be a planar layer that is substantially parallel to the top surface of the die substrate 2102 and does not include sidewall portions substantially perpendicular to the top surface of the die substrate 2102. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2120 may be formed within the die substrate 2102 adjacent to the gate 2122 of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the die substrate 2102 to form the S/D regions 2120. An annealing process that activates the dopants and causes them to diffuse farther into the die substrate 2102 may follow the ion-implantation process. In the latter process, the die substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2120 may be formed using one or more alternate semiconductor materials such as germanium or a group III-V material or alloy. In further examples, one or more layers of metal and/or metal alloys may be used to form the S/D regions 2120.

Electrical signals, such as power and/or input/output (I/O) signals, may be routed to and/or from the devices (e.g., transistors 2140) of the device layer 2104 through one or more interconnect layers disposed on the device layer 2104 (illustrated in FIG. 21 as interconnect layers 2106-2010). For example, electrically conductive features of the device layer 2104 (e.g., the gate 2122 and the S/D contacts 2124) may be electrically coupled with the interconnect structures 2128 of the interconnect layers 2106-2010. The one or more interconnect layers 2106-2010 may form a metallization stack (also referred to as an "ILD stack") 2119 of the IC device 2100.

The interconnect structures 2128 may be arranged within the interconnect layers 2106-2010 to route electrical signals according to a wide variety of designs (in particular, the arrangement is not limited to the particular configuration of interconnect structures 2128 depicted in FIG. 21). Although a particular number of interconnect layers 2106-2010 is depicted in FIG. 21, examples of the present disclosure include IC devices having more or fewer interconnect layers than depicted.

In some examples, the interconnect structures 2128 may include lines 2128a and/or vias 2128b filled with an electrically conductive material such as a metal. The lines 2128a may be arranged to route electrical signals in a direction of a plane that is substantially parallel with a surface of the die substrate 2102 upon which the device layer 2104 is formed. For example, the lines 2128a may route electrical signals in a direction in and out of the page from the perspective of FIG. 21. The vias 2128b may be arranged to route electrical signals in a direction of a plane that is substantially perpendicular to the surface of the die substrate 2102 upon which the device layer 2104 is formed. In some examples, the vias 2128b may electrically couple lines 2128a of different interconnect layers 2106-2010 together.

The interconnect layers 2106-2010 may include a dielectric material 2126 disposed between the interconnect structures 2128, as shown in FIG. 21. In some examples, the dielectric material 2126 disposed between the interconnect structures 2128 in different ones of the interconnect layers 2106-2010 may have different compositions; in other examples, the composition of the dielectric material 2126 between different interconnect layers 2106-2010 may be the same.

A first interconnect layer 2106 (referred to as Metal 1 or "M1") may be formed directly on the device layer 2104. In some examples, the first interconnect layer 2106 may include lines 2128a and/or vias 2128b, as shown. The lines 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some examples, the second interconnect layer 2108 may include vias 2128b to couple the lines 2128a of the second interconnect layer 2108 with the lines 2128a of the first interconnect layer 2106. Although the lines 2128a and the vias 2128b are structurally delineated with a line within each interconnect layer (e.g., within the second interconnect layer 2108) for the sake of clarity, the lines 2128a and the vias 2128b may be structurally and/or materially contiguous (e.g., simultaneously filled during a dual-damascene process) in some examples.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106. In some examples, the interconnect layers that are "higher up" in the metallization stack 2119 in the IC device 2100 (i.e., further away from the device layer 2104) may be thicker.

The IC device 2100 may include a solder resist material 2134 (e.g., polyimide or similar material) and one or more conductive contacts 2136 formed on the interconnect layers 2106-2010. In FIG. 21, the conductive contacts 2136 are illustrated as taking the form of bonding pads. The conductive contacts 2136 may be electrically coupled with the interconnect structures 2128 and configured to route the electrical signals of the transistor(s) 2140 to other external devices. For example, solder bonds may be formed on the one or more conductive contacts 2136 to mechanically and/or electrically couple a chip including the IC device 2100 with another component (e.g., a circuit board). The IC device 2100 may include additional or alternate structures to route the electrical signals from the interconnect layers 2106-2010; for example, the conductive contacts 2136 may include other analogous features (e.g., posts) that route the electrical signals to external components.

Figure 22:
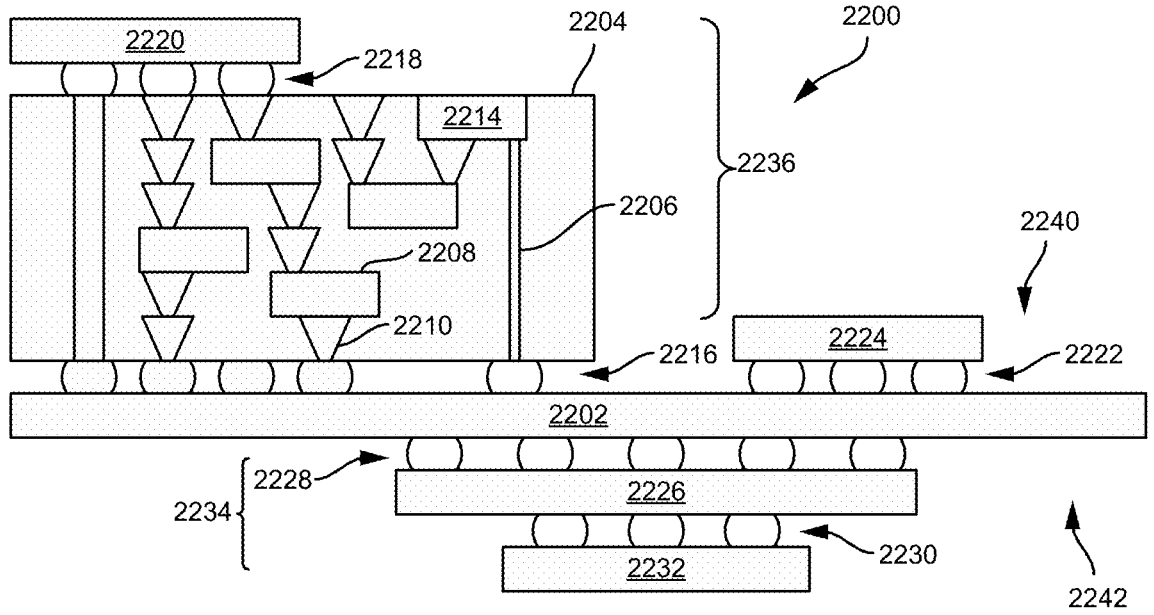
FIG. 22 is a cross-sectional side view of an IC device assembly that may include an IC package constructed in accordance with teachings disclosed herein.

FIG. 22 is a cross-sectional side view of an IC device assembly 2200 that may include the IC package 400 disclosed herein. In some examples, the IC device assembly corresponds to the IC package 400. The IC device assembly 2200 includes a number of components disposed on a circuit board 2202 (which may be, for example, a motherboard). The IC device assembly 2200 includes components disposed on a first face 2240 of the circuit board 2202 and an opposing second face 2242 of the circuit board 2202; generally, components may be disposed on one or both faces 2240 and 2242. Any of the IC packages discussed below with reference to the IC device assembly 2200 may take the form of the example IC package 400 of FIG. 4.

In some examples, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other examples, the circuit board 2202 may be a non-PCB substrate. In some examples, the circuit board 2202 may be, for example, the circuit board 102 of FIG. 1.

The IC device assembly 2200 illustrated in FIG. 22 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 22), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 22, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2002 of FIG. 20), an IC device (e.g., the IC device 2100 of FIG. 21), or any other suitable component. Generally, the interposer 2204 may spread a connection to a wider pitch or reroute a connection to a different connection. For example, the interposer 2204 may couple the IC package 2220 (e.g., a die) to a set of BGA conductive contacts of the coupling components 2216 for coupling to the circuit board 2202. In the example illustrated in FIG. 22, the IC package 2220 and the circuit board 2202 are attached to opposing sides of the interposer 2204; in other examples, the IC package 2220 and the circuit board 2202 may be attached to a same side of the interposer 2204. In some examples, three or more components may be interconnected by way of the interposer 2204.

In some examples, the interposer 2204 may be formed as a PCB, including multiple metal layers separated from one another by layers of dielectric material and interconnected by electrically conductive vias. In some examples, the interposer 2204 may be formed of an epoxy resin, a fiberglass-reinforced epoxy resin, an epoxy resin with inorganic fillers, a ceramic material, or a polymer material such as polyimide. In some examples, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the examples discussed above with reference to the coupling components 2216, and the IC package 2224 may take the form of any of the examples discussed above with reference to the IC package 2220.

The IC device assembly 2200 illustrated in FIG. 22 includes a package-on-package structure 2234 coupled to the second face 2242 of the circuit board 2202 by coupling components 2228. The package-on-package structure 2234 may include a first IC package 2226 and a second IC package 2232 coupled together by coupling components 2230 such that the first IC package 2226 is disposed between the circuit board 2202 and the second IC package 2232. The coupling components 2228, 2230 may take the form of any of the examples of the coupling components 2216 discussed above, and the IC packages 2226, 2232 may take the form of any of the examples of the IC package 2220 discussed above. The package-on-package structure 2234 may be configured in accordance with any of the package-on-package structures known in the art.

Figure 23:
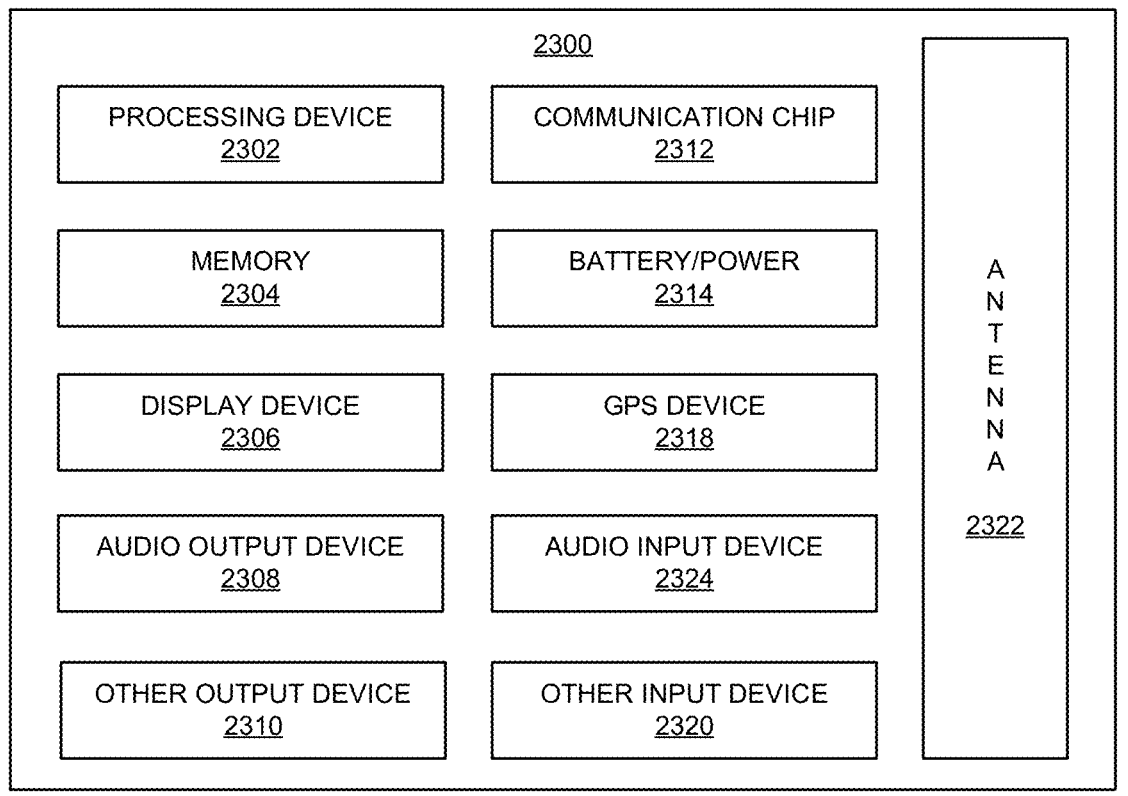
FIG. 23 is a block diagram of an example electrical device that may include an IC package constructed in accordance with teachings disclosed herein.

FIG. 23 is a block diagram of an example electrical device 2300 that may include one or more of the example IC packages 400 of FIG. 4. For example, any suitable ones of the components of the electrical device 2300 may include one or more of the device assemblies 2200, IC devices 2100, or dies 2002 disclosed herein, and may be arranged in the example IC package 400. A number of components are illustrated in FIG. 23 as included in the electrical device 2300, but any one or more of these components may be omitted or duplicated, as suitable for the application. In some examples, some or all of the components included in the electrical device 2300 may be attached to one or more motherboards. In some examples, some or all of these components are fabricated onto a single system-on-a-chip (SoC) die.

Additionally, in various examples, the electrical device 2300 may not include one or more of the components illustrated in FIG. 23, but the electrical device 2300 may include interface circuitry for coupling to the one or more components. For example, the electrical device 2300 may not include a display device 2306, but may include display device interface circuitry (e.g., a connector and driver circuitry) to which a display device 2306 may be coupled. In another set of examples, the electrical device 2300 may not include an audio input device 2324 or an audio output device 2308, but may include audio input or output device interface circuitry (e.g., connectors and supporting circuitry) to which an audio input device 2324 or audio output device 2308 may be coupled.

The electrical device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2300 may include a memory 2304, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2304 may include memory that shares a die with the processing device 2302. This memory may be used as cache memory and may include embedded dynamic random access memory (eDRAM) or spin transfer torque magnetic random access memory (STT-MRAM).

In some examples, the electrical device 2300 may include a communication chip 2312 (e.g., one or more communication chips). For example, the communication chip 2312 may be configured for managing wireless communications for the transfer of data to and from the electrical device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other examples. The electrical device 2300 may include an antenna 2322 to facilitate wireless communications and/or to receive other wireless communications (such as AM or FM radio transmissions).

In some examples, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some examples, a first communication chip 2312 may be dedicated to wireless communications, and a second communication chip 2312 may be dedicated to wired communications.

The electrical device 2300 may include battery/power circuitry 2314. The battery/power circuitry 2314 may include one or more energy storage devices (e.g., batteries or capacitors) and/or circuitry for coupling components of the electrical device 2300 to an energy source separate from the electrical device 2300 (e.g., AC line power).

The electrical device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display.

The electrical device 2300 may include an audio output device 2308 (or corresponding interface circuitry, as discussed above). The audio output device 2308 may include any device that generates an audible indicator, such as speakers, headsets, or earbuds.

The electrical device 2300 may include an audio input device 2324 (or corresponding interface circuitry, as discussed above). The audio input device 2324 may include any device that generates a signal representative of a sound, such as microphones, microphone arrays, or digital instruments (e.g., instruments having a musical instrument digital interface (MIDI) output).

The electrical device 2300 may include a GPS device 2318 (or corresponding interface circuitry, as discussed above). The GPS device 2318 may be in communication with a satellite-based system and may receive a location of the electrical device 2300, as known in the art.

The electrical device 2300 may include any other output device 2310 (or corresponding interface circuitry, as discussed above). Examples of the other output device 2310 may include an audio codec, a video codec, a printer, a wired or wireless transmitter for providing information to other devices, or an additional storage device.

The electrical device 2300 may include any other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2300 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2300 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that significantly reduce the overall thickness of an on-package memory architecture relative to known on-package memory architectures by eliminating the memory package substrate and the associated ball grid array that enables such known architectures to be coupled to a main package substrate. Reducing the overall thickness of an on-package memory architecture in this manner significantly simplifies the manufacture of IC packages containing such architectures because it is possible to attach a planar (flat) heat spreader across the surface of both the on-package memory architecture and/or an adjacent processor die. Further, eliminating the memory package substrate and associated BGA improve the efficiency of the IC package by eliminating the routing that must otherwise occur through the memory package substrate. Disclosed systems, methods, apparatus, and articles of manufacture are accordingly directed to one or more improvement(s) in the operation of a machine such as a computer or other electronic and/or mechanical device.

Example 1 includes an on-package memory architecture comprising a memory die, a bonding pad including a first surface and a second surface opposite the first surface, a wire bond electrically coupling the memory die to the first surface of the bonding pad, and a metal stub protruding from the second surface of the bonding pad, the metal stub to electrically couple with a contact pad on a package substrate of an integrated circuit (IC) package.

Example 2 includes the on-package memory architecture of example 1, further including a mold compound encapsulating the memory die and the wire bond, the mold compound to encapsulate side walls of the bonding pad, the side walls extending between the first and second surfaces of the bonding pad.

Example 3 includes the on-package memory architecture of example 2, wherein the second surface of the bonding pad is flush with a bottom surface of the mold compound.

Example 4 includes the on-package memory architecture of example 1, wherein the memory die is a first memory die, the on-package memory architecture further including a second memory die stacked on the first memory die.

Example 5 includes the on-package memory architecture of example 1, wherein the bonding pad is a first bonding pad, and the metal stub is a first metal stub, the on-package memory architecture further including a second bonding pad spaced apart from the first bonding pad, and a second metal stub protruding from the second bonding pad.

Example 6 includes the on-package memory architecture of example 5, wherein the first metal stub is spaced apart from the second metal stub by a pitch of less than or equal to 110 micrometers.

Example 7 includes the on-package memory architecture of example 5, wherein the memory die is laterally between the first bonding pad and the second bonding pad such that the memory die and the first and second bonding pads are in a common plane.

Example 8 includes the on-package memory architecture of example 1, wherein the on-package memory architecture does not include a ball grid array.

Example 9 includes the on-package memory architecture of example 1, wherein the on-package memory architecture does not include a package substrate to facilitate electrical coupling of the on-package memory architecture to the package substrate of the IC package.

Example 10 includes the on-package memory architecture of example 1, further including a metal plate extending in a plane aligned with the metal stub.

Example 11 includes an apparatus comprising a substrate, a processor die mounted to the substrate, and a memory die mounted to the substrate, the memory die adjacent the processor die on a same side of the substrate as the processor die, the memory die electrically coupled to the substrate without an intervening substrate.

Example 12 includes the apparatus of example 11, further including a bonding pad, the memory die electrically coupled to a first surface of the bonding pad, and a metal stub protruding from a second surface of the bonding pad, the second surface opposite the first surface, an end of the metal stub soldered to a contact pad on the substrate.

Example 13 includes the apparatus of example 12, further including an underfill material within gaps between the memory die and the substrate, the underfill material to surround the metal stub.

Example 14 includes the apparatus of example 12, wherein the memory die is encapsulated in a mold compound, a bottom surface of the mold compound to face toward a top surface of the substrate, the bottom surface of the mold compound less than 50 micrometers from the top surface of the substrate.

Example 15 includes the apparatus of example 14, wherein the memory die includes a first side and a second side opposite the first side, the first side of the memory die to face in a same direction as the first surface of the bonding pad, the second side of the memory die closer to the bottom surface of the mold compound than the second surface of the bonding pad is to the bottom surface.

Example 16 includes the apparatus of example 14, wherein the bonding pad is encased in the mold compound.

Example 17 includes the apparatus of example 12, wherein the memory die, the bonding pad, and the metal stub are part of an on-package memory architecture, an overall thickness of the on-package memory architecture is within 10 micrometers of a thickness of the processor die.

Example 18 includes the apparatus of example 17, further including a heat spreader, the heat spreader having a single planar surface that is attached to both the on-package memory architecture and the processor die.

Example 19 includes a method for manufacturing an integrated circuit (IC) package, the method comprising fabricating an on-package memory architecture that includes a metal stub protruding from a surface of a bonding pad, the on-package memory architecture including a memory die electrically coupled to the bonding pad, mounting a processor die to a package substrate of the IC package, and mounting the on-package memory architecture to the package substrate adjacent the processor die, the on-package memory architecture mounted to the package substrate by thermocompression bonding of the metal stub with a contact pad on the package substrate.

Example 20 includes the method of example 19, further including attaching a first surface of a heat spreader to both the on-package memory architecture and the processor die, the first surface to extend continuously across upper surfaces of both the on-package memory architecture and the processor die.

Example 21 includes the method of example 19, wherein the fabricating of the on-package memory architecture includes encasing the memory die and the bonding pad in a mold compound.

Example 22 includes the method of example 19, wherein the fabricating of the on-package memory architecture includes depositing metal into an opening in a dry film resist on an underlying layer of metal, the metal deposited into the opening to produce the bonding pad, attaching the memory die to the underlying layer of metal, and etching the underlying layer of metal to produce the metal stub.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:
   a substrate;
   a processor die mounted to the substrate;
   a memory die mounted to the substrate, the memory die adjacent the processor die on a same side of the substrate as the processor die, the memory die including a first side and a second side opposite the first side, the first side of the memory die facing away from the substrate;
   a bonding pad, the memory die electrically coupled to a first surface of the bonding pad, the first surface of the bonding pad facing away from the substrate, the second side of the memory die closer to the substrate than the first surface of the bonding pad is to the substrate; and
   a metal stub protruding from a second surface of the bonding pad, the second surface opposite the first surface, an end of the metal stub soldered to a contact pad on the substrate.

2. The apparatus of claim 1, including an underfill material within gaps between the memory die and the substrate, the underfill material to surround the metal stub.

3. The apparatus of claim 2, including a mold compound to encapsulate the memory die, the mold compound different from the underfill material.

4. The apparatus of claim 1, wherein the memory die is encapsulated in a mold compound, a bottom surface of the mold compound to face toward a top surface of the substrate, the bottom surface of the mold compound less than 50 micrometers from the top surface of the substrate.

5. The apparatus of claim 4, wherein the bonding pad is encased in the mold compound.

6. The apparatus of claim 5, wherein the metal stub protrudes beyond the bottom surface of the mold compound.

7. The apparatus of claim 1, wherein the memory die, the bonding pad, and the metal stub are part of an on-package memory architecture, an overall thickness of the on-package memory architecture is within 10 micrometers of a thickness of the processor die.

8. The apparatus of claim 7, wherein the memory die is a first memory die, and the on-package memory architecture includes a mold compound that encases the first memory die and a second memory die stacked on the first memory die, the mold compound defining a bottom surface of the on-package memory architecture, the bottom surface to face towards the substrate, the first memory die to be closer to the substrate than the second memory die is to the substrate.

9. The apparatus of claim 7, including a heat spreader, the heat spreader having a single planar surface that is attached to both the on-package memory architecture and the processor die.

10. The apparatus of claim 1, including a wire bond electrically coupling the memory die to the first surface of the bonding pad.

11. The apparatus of claim 1, wherein the memory die is a first memory die, the apparatus including a second memory die stacked on the first memory die.

12. The apparatus of claim 1, wherein the bonding pad is a first bonding pad, and the metal stub is a first metal stub, the apparatus including:
   a second bonding pad spaced apart from the first bonding pad; and
   a second metal stub protruding from the second bonding pad.

13. The apparatus of claim 12, wherein the first metal stub is spaced apart from the second metal stub by a pitch of less than or equal to 110 micrometers.

14. The apparatus of claim 12, wherein the first bonding pad is laterally between the memory die and the second bonding pad.

15. The apparatus of claim 1, wherein the memory die, the bonding pad, and the metal stub are part of an on-package memory architecture, and the on-package memory architecture does not include a ball grid array.

16. The apparatus of claim 15, wherein lateral sides of the on-package memory architecture are defined by a mold compound that encases the memory die, and the bonding pad is spaced apart from the lateral sides of the on-package memory architecture.

17. The apparatus of claim 1, wherein the memory die, the bonding pad, and the metal stub are part of an on-package memory architecture, and the on-package memory architecture does not include a package substrate to facilitate electrical coupling of the memory die to the substrate to which the processor die is mounted.

18. The apparatus of claim 1, including a metal plate extending in a plane aligned with the metal stub.

19. An apparatus comprising:
a substrate;
a processor die carried by the substrate;
a memory die carried by the substrate, the memory die adjacent the processor die on a same side of the substrate as the processor die;

a bonding pad, the memory die electrically coupled to a first surface of the bonding pad;
a metal stub protruding from a second surface of the bonding pad, the second surface opposite the first surface, an end of the metal stub soldered to a contact pad on the substrate; and
a mold compound that encapsulates the memory die and all side walls of the bonding pad, the side walls extending between the first and second surfaces of the bonding pad.

20. The apparatus of claim 19, wherein the second surface of the bonding pad is flush with a bottom surface of the mold compound.

21. The apparatus of claim 19, wherein the metal stub is spaced apart from the mold compound.

22. An apparatus comprising:
a substrate;
a processor die carried by the substrate;
a memory die carried by the substrate, the memory die adjacent the processor die on a same side of the substrate as the processor die;
a first bonding pad; and
a second bonding pad, the memory die electrically coupled to at least one of the first bonding pad or the second bonding pad, the memory die laterally between the first bonding pad and the second bonding pad such that the memory die and the first and second bonding pads are in a common plane.

* * * * *